United States Patent
Iijima et al.

(10) Patent No.: US 6,783,636 B2
(45) Date of Patent: Aug. 31, 2004

(54) METHOD OF PRODUCING POLYCRYSTALLINE THIN FILM OF MGO

(75) Inventors: Yasuhiro Iijima, Tokyo (JP); Mariko Kimura, Tokyo (JP); Takashi Saito, Tokyo (JP)

(73) Assignee: Fujikura Ltd., Tokyo (JP)

( * ) Notice: Subject to any disclaimer, the term of this patent is extended or adjusted under 35 U.S.C. 154(b) by 533 days.

(21) Appl. No.: 09/958,367

(22) PCT Filed: Feb. 9, 2001

(86) PCT No.: PCT/JP01/00911

§ 371 (c)(1),
(2), (4) Date: Oct. 5, 2001

(87) PCT Pub. No.: WO01/59173

PCT Pub. Date: Aug. 16, 2001

(65) Prior Publication Data

US 2002/0157601 A1 Oct. 31, 2002

(30) Foreign Application Priority Data

Feb. 9, 2000 (JP) ........................ 2000-32467

(51) Int. Cl.⁷ .............................................. C23C 14/46
(52) U.S. Cl. ................................................. 204/192.11
(58) Field of Search ..................................... 204/192.11

(56) References Cited

U.S. PATENT DOCUMENTS 6,039,847 A  *  3/2000  Chayahara et al. .... 204/192.11

FOREIGN PATENT DOCUMENTS

| EP | 0 872579 A1 | 10/1998 | ........... C30B/28/00 |
|---|---|---|---|
| JP | 6-145977 | 5/1994 | ........... C23C/14/46 |
| JP | 10-91958 | 4/1998 | ........... G11B/5/85 |
| JP | 10-121238 | 5/1998 | ........... C23C/14/46 |
| JP | 10-231122 | 9/1998 | ........... C01G/3/00 |
| JP | 2000-99944 | 4/2000 | ........... G11B/5/85 |
| WO | WO98/17846 | 4/1998 | ........... C30B/28/00 |

OTHER PUBLICATIONS

Douyama, M., et al., "Zairyou Technology 9 Zairyo no Process Gijutsu [I]" Nov. 30, 1987, Tokyo Daigaku Shuppan, pp. 13S, Line 8—p. 138, Last Line.

* cited by examiner

Primary Examiner—Steven H. VerSteeg
(74) Attorney, Agent, or Firm—Bell, Boyd & Lloyd LLC

(57) ABSTRACT

A polycrystalline thin film of MgO is formed on a substrate by an ion sputtering process wherein the thin film is obtained by irradiating a target with an ion beam to dislodge particles from the target and deposit the particles on the substrate. The film is preferably formed in an atmosphere at a reduced pressure of $3.0 \times 10^{-2}$ Pa or lower while keeping the substrate temperature at 300° C. or lower.

9 Claims, 2 Drawing Sheets

METHOD OF PRODUCING POLYCRYSTALLINE THIN FILM OF MGO

TECHNICAL FIELD

The present invention relates to a method of producing a polycrystalline thin film of MgO which has good crystal orientation, a low surface roughness and a flat surface, and which can be used as an intermediate layer of a superconductor, an insulation layer of a plasma display panel or the like.

BACKGROUND ART

Recently, technology for forming various films of good orientation on a substrate made of a polycrystalline or amorphous material by means of a sputtering apparatus has been employed. The technology is applied, for example, to the fields of oxide superconductors, optical thin films, magneto-optical disks, interconnection substrates, high-frequency filters and cavity resonators, in all of which there is the problem of forming a polycrystalline thin film having a stable film quality and good crystal orientation on the substrate. This is because a polycrystalline thin film having good crystal orientation makes it possible to improve the quality of a superconducting thin film, an optical thin film, a magnetic thin film or an interconnection thin film to be formed thereon.

One typical example of the polycrystalline thin film formed on a substrate is a polycrystalline thin film of MgO.

A method of producing the polycrystalline thin film of MgO in the prior art is the sputtering method in which particles of a target material are dislodged and then deposited on the substrate. The sputtering method can be implemented in the form of diode glow discharge sputtering which uses glow discharge across a pair of electrodes, magnetron sputtering or other processes.

In such sputtering processes, a target made of the same material as the polycrystalline thin film to be formed is bombarded by accelerated particles such as ions in a vacuum of about $10^{-1}$ Pa, so that the particles of the target material are dislodged and then deposited on the substrate.

The accelerated particles such as ions can also be made to collide with the target by the use of glow discharge.

However, with these methods of producing the polycrystalline thin film of MgO, the substrate must be held at a high temperature in a range of from 300 to 1000° C., in order to form a polycrystalline thin film of good crystal orientation, in which planes of low indices such as (100) and (110) are oriented vertically, on a substrate made of a polycrystalline or amorphous material such as a metal of non-aligned crystal orientation.

If an MgO film is formed at such a high temperature, the MgO crystal grains become coarse when depositing the MgO particles on the substrate, thus leading to the problem that the surface roughness of the polycrystalline thin film increases, resulting in a rough surface. When the polycrystalline thin film has a rough surface, the quality of the thin film formed on the polycrystalline thin film becomes unsatisfactory, that is, the crystal orientation is disturbed.

Also with these production methods, since the ions which dislodge the particles from the target are generated by using glow discharge in the vessel which is used to form the film, a plasma is generated in the vacuum vessel and the substrate is placed in the plasma. Therefore, the crystal orientation of the MgO is expected to be adversely affected by the plasma which hits the substrate surface.

For these reasons, a thin film of good crystal orientation cannot be obtained when a polycrystalline thin film of MgO is formed as an intermediate layer on a substrate of a polycrystalline or amorphous material and another thin film is formed on this intermediate layer.

For example, when a polycrystalline thin film of MgO is formed as an intermediate layer on a substrate such as a metal tape by the sputtering method and an oxide superconductor is made by forming an oxide superconducting layer on the intermediate layer by a laser beam deposition or sputtering process, the oxide superconducting layer thus formed shows a critical current density lower than that of an oxide superconducting layer formed on a single crystal substrate.

Such a problem suggests a poor crystal orientation of the oxide superconducting layer. Since the oxide superconducting layer is grown so as to match the crystal structure of the intermediate layer when forming the film, the crystal orientation of the oxide superconducting layer is affected by the conditions of the intermediate layer, namely the crystal orientation and the surface conditions thereof. Thus the problem is assumed to be caused by poor crystallinity of the intermediate layer, namely the polycrystalline thin film of MgO, and/or the rough surface thereof.

In the production methods of the prior art, as described above, it has been difficult to form a polycrystalline thin film of MgO of good crystal orientation and satisfactory surface roughness on a polycrystalline or amorphous substrate.

DISCLOSURE OF THE INVENTION

The present invention has been made to solve the problems described above and an object of the present invention is to provide a method of producing a polycrystalline thin film of MgO which has good crystal orientation, low surface roughness and a flat surface.

In order to solve the problem described above, the present invention provides a method of producing a polycrystalline thin film of MgO, wherein an ion beam sputtering process is employed to form the polycrystalline thin film of MgO on a substrate by irradiating a target with an ion beam to dislodge particles from the target and deposit the particles on the substrate.

With the method of producing the polycrystalline thin film of MgO of the present invention, since an ion beam sputtering method is employed wherein the target is irradiated with an ion beam to dislodge particles from the target and the particles are deposited on a substrate, thereby forming the polycrystalline thin film of MgO, the substrate is not heated to a high temperature nor exposed to plasma, and therefore it becomes possible to form a polycrystalline thin film of MgO which has good crystal orientation, a lower surface roughness and a flat surface.

With the method of producing the polycrystalline thin film of MgO of the present invention having the constitution described above, it is preferable to form the film by the ion beam sputtering process in an atmosphere with a pressure reduced to $3.0 \times 10^{-2}$ Pa or lower, because this makes it possible to improve the sputtering rate, form a polycrystalline thin film of uniform MgO crystal grains on the substrate and decrease the surface roughness.

Also, because the film is formed in a vessel (film forming chamber) which is evacuated to $3.0 \times 10^{-2}$ Pa or lower, a higher degree of vacuum than that used in conventional sputtering processes ($1.0 \times 10^{-1}$ Pa), the crystallinity of the MgO can be improved, namely the (110) plane can be oriented vertically, and a polycrystalline thin film of MgO of better crystal orientation can be formed.

With the method of producing the polycrystalline thin film of MgO of the present invention having the constitution described above, it is preferable to form the film by the ion beam sputtering method while keeping the substrate temperature at 300° C. or lower, because this results in a polycrystalline thin film of MgO having a surface roughness of about 10 nm or less, thus forming a polycrystalline thin film having satisfactory surface conditions.

Also, with the method of producing the polycrystalline thin film of MgO of the present invention having the constitution described above, it is preferable to form the film by the ion beam sputtering process while keeping the substrate temperature in a range from 0 to 200° C., because this results in a polycrystalline thin film of MgO having a surface roughness in a range from about 2 to 3 nm, thus forming a polycrystalline thin film having satisfactory surface conditions.

With the method of producing the polycrystalline thin film of MgO of the present invention having the constitution described above, it is preferable to form the film by the ion beam sputtering process with the ion beam energy being controlled in a range from 1000 to 2000 eV, because this allows a sufficient amount of energy to be imparted to the Mg and O atoms which have been dislodged from the target, thereby promoting migration to the MgO film surface and achieving favorable surface conditions.

With the method of producing the polycrystalline thin film of MgO of the present invention having the constitution described above, it is more preferable to form the film by the ion beam sputtering process with the ion beam energy controlled in a range from 1200 to 1500 eV, because this allows a sufficient amount of energy to be imparted to the Mg and O atoms which have been dislodged from the target, thereby promoting migration to the MgO film surface and achieving favorable surface conditions, while avoiding the adverse effect of an increase in the target temperature.

With the method of producing the polycrystalline thin film of MgO of the present invention, as described above, the sputtering rate can be improved to achieve a better film quality and obtain a polycrystalline thin film of MgO of further improved crystal orientation, by carrying out the ion beam sputtering process in an atmosphere of a reduced pressure of $3.0 \times 10^{-2}$ Pa or lower and/or at a substrate temperature of 300° C. or lower.

MODE FOR CARRYING OUT THE INVENTION

Preferred embodiments of the present invention will now be described below with reference to the accompanying drawings.

Figure 1:
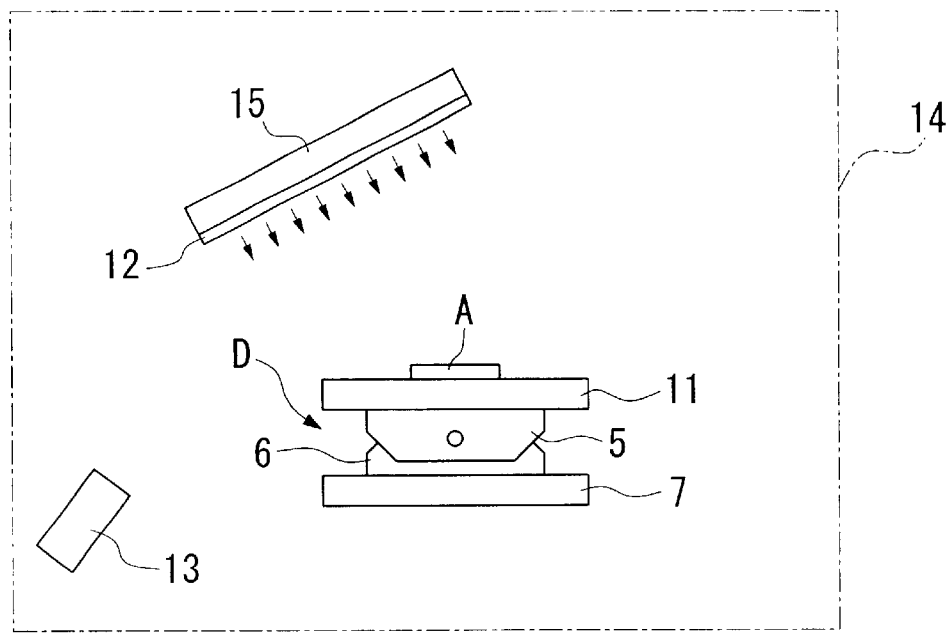
FIG. 1 is a schematic diagram showing an example of the apparatus used in the method of forming the MgO film of the present invention.

FIG. 1 is a schematic diagram showing an example of the apparatus used in the method of forming the polycrystalline thin film of MgO of the present invention. The apparatus of this example has a constitution wherein a sputtering apparatus is provided with an ion source for ion beam assisting operation.

The apparatus comprises a substrate holder 11 which holds a substrate A, a target 12 having the configuration of a plate disposed above the substrate holder 11 facing it obliquely at a predetermined distance, and a sputtering beam radiating device 13 disposed below the target 12 facing the bottom surface of the target 12.

Reference numeral 15 in the drawings denotes a target holder which holds the target 12.

This apparatus is accommodated in a vacuum chamber (film forming vessel) 14 which can be pumped to a vacuum, not shown in the drawing, so as to place the substrate A in a vacuum. The vacuum chamber is also connected to an ambient gas source such as a gas cylinder so as to keep an inert gas atmosphere such as argon gas, or an inert gas atmosphere which includes oxygen at a low pressure, in the vacuum chamber.

The substrate holder 11 has a heater or a cooling device (not shown) installed therein to keep the substrate placed on the substrate holder 11 at a desired temperature. An angle regulating mechanism D is installed at the bottom of the substrate holder 11. The angle regulating mechanism D comprises a lower support plate 6 which is connected by a pin to an upper support plate 5 that is joined with the bottom of the substrate holder 11, and a base 7 which supports the lower support plate 6. The upper support plate 5 and the lower support plate 6 are arranged to be able to swivel freely with respect to each other via the pin joint, so that the horizontal angle of the substrate holder 11 can be adjusted.

The substrate A may be in various forms such as a sheet, a wire or a tape. The substrate A is made of metal or an alloy such as silver, platinum, copper, stainless steel or HASTELLOY alloy, or a polycrystalline or amorphous material such as glass or ceramic.

If a long metal tape (made of HASTELLOY alloy tape, stainless steel tape or the like) is used for the substrate A, it is preferable to use a constitution with a tape feeder and a take-up device for the metal tape installed in the vacuum vessel so that a polycrystalline thin film is continuously formed on the tape-shaped substrate while the substrate A is supplied continuously from the tape feeder to the substrate holder 11 and is wound up by the take-up device.

The target 12 is provided for the purpose of forming the desired polycrystalline thin film of MgO, and is made of a material having the same or a similar composition to MgO. Specifically, the target 12 is made of sintered MgO or a sheet of metal Mg. The target 12 is mounted on the target holder 15 which pivots by means of a pin or the like so as to swivel freely, in order to adjust the angle of inclination thereof and accordingly adjust the incident angle of the ion beam.

The sputtering beam radiating device 13 is capable of irradiating the target 12 with ions so as to dislodge particles from the target 12. The sputtering beam radiating device 13 has a constitution such that an evaporation source is housed in a vessel and a grid is installed near the evaporation source for applying a voltage. A portion of the atoms or molecules evaporated from the evaporation source are ionized, and the ionized particles are controlled by the electric field generated by the grid thereby forming an ion beam for irradiation. The particles may be ionized by various methods such as direct current discharge, radio frequency excitation, filament heating and the cluster ion beam method. The filament heating method generates thermal electrons by the heat generated by a current flowing in a tungsten filament and causes the electrons to collide with the evaporated particles in a high vacuum, thereby ionizing the particles. With the cluster ion beam method, a cluster of molecules injected from a nozzle provided in an aperture of a crucible that contains an evaporation source material, into a vacuum atmosphere, is hit by thermal electrons so as to be ionized and radiated.

Figure 2:
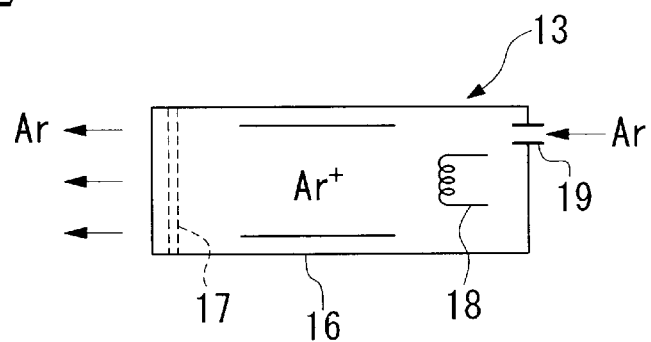
FIG. 2 is a schematic diagram showing an example of the ion beam irradiation apparatus used in the method of forming the MgO film of the present invention.

In this example, the sputtering beam radiating device 13 has an internal structure such as that shown in FIG. 2. The sputtering beam radiating device 13 comprises a cylindrical vessel 16 which contains a grid 17, a filament 18 and an intake tube 19 for introducing gas such as Ar installed therein, and is capable of emitting ions in a substantially parallel beam from the distal end of the vessel 16.

For the ion beam applied by the sputtering beam radiating device 13 to the target 12, a mixture of Ar and oxygen ions, ions of rare gas elements such as $He^+$, $Ne^+$, $Ar^+$, $Xe^+$ or $Kr^+$, or a mixture of these and oxygen ions may be used.

In order to form the polycrystalline thin film of MgO on the substrate A by a apparatus having the constitution described above, first, a target 12 made of MgO or Mg is mounted on the target holder 15. Then the vessel which houses the substrate A is pumped to a vacuum to reduce the pressure therein. The reduced pressure is preferably about $3.0 \times 10^{-2}$ Pa or lower. This pressure means a higher vacuum than that used in ordinary sputtering processes, and makes it possible to improve the sputtering rate, form a polycrystalline thin film having well-aligned crystal grains on the substrate A and decrease the surface roughness thereof.

Then the operation of the sputtering beam radiating device 13 is started.

As the target 12 is irradiated with an ion beam emitted by the sputtering beam radiating device 13, particles which are dislodged from the target 12 by the ion beam are deposited on the substrate A, so that the polycrystalline thin film of a desired thickness can be formed.

The intensity of the ion beam emitted from the sputtering beam radiating device 13 is preferably controlled so that the ion beam energy is in a range from about 1000 to 2000 eV, more preferably in a range from about 1200 to 1500 eV, and the ion current density is in a range from 1 to 10 $mA/cm^2$, depending on the ion species.

When the sputtering beam radiating device 13 is used in the sputtering process as described above, the MgO grains can be aligned so that the (110) plane is oriented steeply vertically on the substrate A even at room temperature.

The reason why a polycrystalline thin film having a good crystal orientation of the MgO grains and a lower surface roughness of the film can be formed at room temperature is assumed to be as follows.

First, in the ordinary sputtering process, since the target material is turned into a plasma when forming the film, the vacuum chamber is filled with the plasma and therefore the substrate is surrounded by the plasma, thus leading to poor crystallinity of the thin film. For this reason, it is a common practice to form a film while heating the ambient atmosphere to a high temperature, e.g., 400 to 600° C. or higher, in order to form a thin film having good crystallinity. The fact that a thin film having good crystallinity is generally obtained by heating to such a high temperature means that there is a close relationship between the film forming temperature and the crystallinity, and it is believed that a highly amorphous film can be easily formed when the film forming temperature is lower in the thin film forming process.

When an MgO film is formed in a high temperature atmosphere as described above, however, the crystal grains become coarse in the film forming surface, resulting in a rougher surface and a deteriorated surface of the polycrystalline thin film of MgO.

Based on these considerations, the present invention has a constitution wherein the sputtering beam radiating device 13 is used as the ion source while plasma is generated in this device so that the substrate A is not exposed to the plasma. Thus according to the method of forming the polycrystalline thin film of MgO of the present invention, the substrate is not affected by the plasma and therefore the film can be formed at room temperature. As a result, since the film is not formed at a high temperature, the MgO crystal grains do not become coarse and fine crystal particles deposit so that the surface roughness decreases and a polycrystalline thin film of MgO with more flat surface can be formed.

With the method of forming the polycrystalline thin film of MgO of the present invention, since the sputtering beam radiating device 13 is used, the inside of the vessel can be evacuated to a higher degree of vacuum than in the case of an ordinary sputtering process (about $1.0 \times 10^{-1}$ Pa). Thus, since the crystallinity of the MgO can be improved, i.e., the (110) plane can be oriented vertically, a polycrystalline thin film of MgO of better crystal orientation can be formed.

Also because the degree of vacuum can be increased and the substrate A is not exposed to a plasma, the sputtering rate or the number of atoms sputtered by one accelerated particle (positive ions in this case) which hit the target increases, so that satisfactory deposition of the MgO particles on the substrate A can be achieved.

The polycrystalline thin film of MgO having good crystal orientation and a flat surface formed in the production process described above can be used as an insulation layer for a plasma display, an intermediate layer of an oxide superconductor or the like.

For example, an oxide superconductor can be made by forming an oxide superconducting layer made of an oxide superconducting material on a polycrystalline thin film of MgO which has been formed on a polycrystalline or amorphous substrate.

The oxide superconducting layer may be formed by such methods as sputtering a target made of a material having the same or a similar composition as the intended oxide superconducting material in an oxygen gas atmosphere thereby forming the oxide superconducting layer on the polycrystalline thin film of MgO, or by a laser beam deposition method wherein the target is irradiated with a laser beam to dislodge particles from the target thereby depositing the particles.

The oxide superconducting material which forms the oxide superconducting layer is a high critical temperature oxide superconducting material having a composition represented by $Y_1Ba_2Cu_3O_{7-x}$, $Y_2Ba_4Cu_8O_y$ or $Y_3Ba_3Cu_6O_y$, or a composition of $(Bi, Pb)_2Ca_2Sr_2Cu_3O_y$ or $(Bi, Pb)_2Ca_2Sr_3Cu_4O_y$, or a composition of $Tl_2Ba_2Ca_2Cu_3O_y$, $Tl_1Ba_2Ca_2Cu_3O_y$ or $Tl_1Ba_2Ca_3Cu_4O_y$.

Since the polycrystalline thin film of MgO according to the present invention has excellent crystal orientation and is flat with a low surface roughness, the oxide superconducting layer formed on the polycrystalline thin film can be obtained with the crystal grains of the oxide superconducting material aligned so as to match the orientation of the polycrystalline thin film of MgO.

The effects of the present invention were investigated by the experiments described below.

(Experiment 1)

A polycrystalline thin film of MgO was formed by sputtering with ion beam irradiation by using an apparatus of the constitution shown in FIG. 1.

With the vacuum vessel accommodating the apparatus shown in FIG. 1 being evacuated by means of a vacuum pump to decrease the pressure to $2.0 \times 10^{-2}$ Pa, a mixed gas of Ar and $O_2$ was supplied into the vacuum vessel, with a flow rate of 8.0 $cm^3$/min for Ar on the basis of 8.0 sccm (0° C., 1 atm. (1013 hPa)) and a flow rate of 4.0 $cm^3$/min for $O_2$ gas on the basis of 4.0 sccm (0° C., 1 atm. (1013 hPa)).

A tape of HASTELLOY C276 alloy measuring 10 mm in width, 0.5 mm in thickness and several meters in length which was polished to mirror quality finish was used as the substrate. The target was made of sintered MgO. The target was sputtered with $Ar^+$ ion beam being set to 1200 eV and the ion current density being set to 5 $mA/cm^2$.

Then the substrate held by the substrate holder was fed at a constant speed thereby to form a polycrystalline thin film of MgO having a thickness of 1100 nm on the substrate tape.

The temperature during the film forming process was controlled to 100° C.

The polycrystalline thin film of MgO thus obtained was subjected to X-ray diffraction analysis by the θ-2θ method using the CuKα ray.

Figure 3:
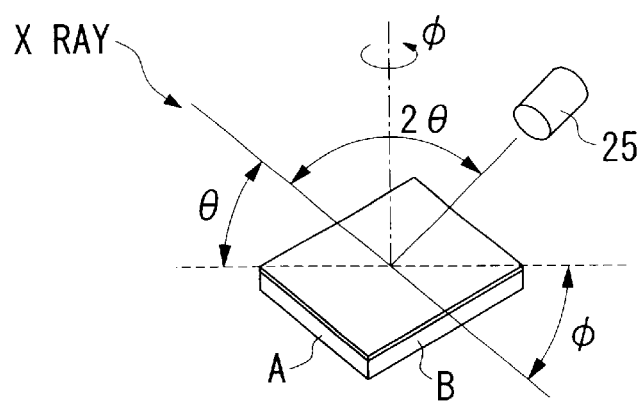
FIG. 3 is a schematic diagram showing the setup for the X-ray diffraction test.

The X-ray diffraction analysis by the θ-2θ method was conducted as follows. The polycrystalline thin film B of MgO which was formed on the substrate A as shown in FIG. 3 was irradiated with X rays at an incident angle of θ, and the diffraction intensity was measured by an X-ray counter 25 installed at an angle of 2 θ with respect to the incident X ray in a vertical plane including the X ray path, while changing the horizontal angle ø from the vertical plane which included the X ray path, namely rotating the substrate A as indicated by the arrow in FIG. 3.

Figure 4:
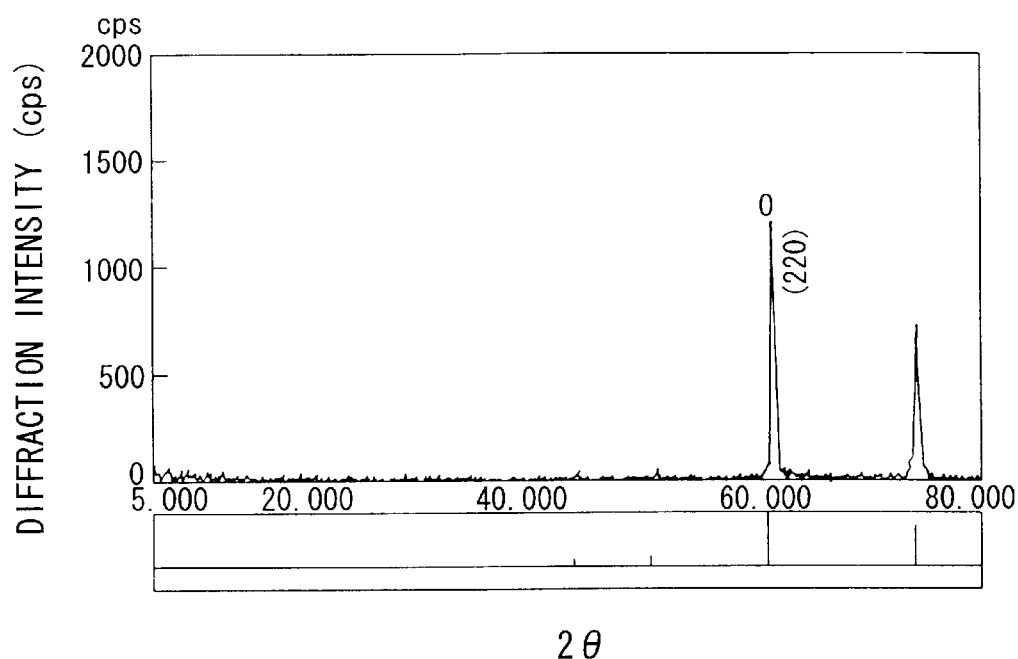
FIG. 4 is a graph showing the X-ray diffraction intensity for one embodiment.

The diffraction intensities measured by the X-ray diffraction test on the polycrystalline thin film of MgO of this embodiment are shown in FIG. 4.

From the results shown in FIG. 4, a peak due to the (220) plane is observed and it can be assumed that the (110) plane of the polycrystalline thin film of MgO is oriented at right angles to the substrate surface.

Figure 5:
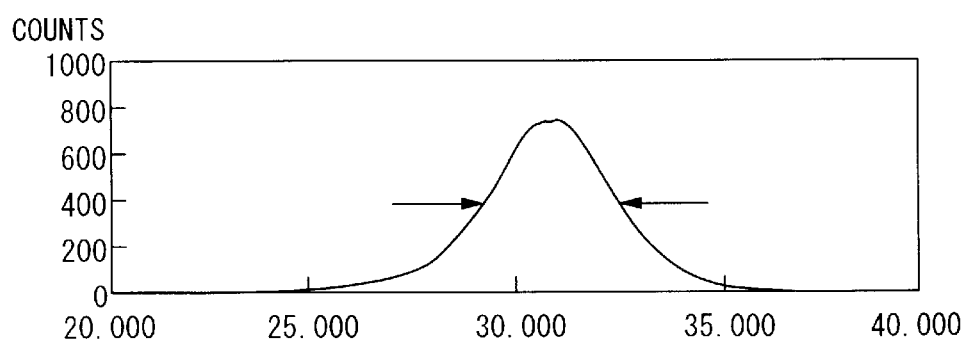
FIG. 5 is a graph showing the integrated diffraction intensity for another embodiment.

The integrated intensity of the rocking curve of the (220) peak is shown in FIG. 5.

From the graph shown in FIG. 5, it can be assumed that the (220) plane is aligned vertically since the peak of the (220) plane has a narrow width of 3.4°.

Thus it can safely be said that the polycrystalline thin film of MgO has excellent crystal orientation.

(Experiment 2)

Polycrystalline thin films of MgO were formed similarly to the first experiment except for changing the substrate temperature when forming the MgO film, and the surface roughness of each of the polycrystalline thin films of MgO was measured. The crystal orientation of the polycrystalline thin film of MgO was also evaluated by means of the (220) full width at half maximum (half width)(rocking curve), with the result shown in Table 1.

The results indicate that a good polycrystalline thin film having a low surface roughness (within 10 nm) can be formed when the substrate temperature is kept at 300° C. or lower. It can also be seen that a good polycrystalline thin film having a low surface roughness of about 3 nm or lower can be formed when the substrate temperature is kept in a range from 0 to 200° C. It can also be seen that a good polycrystalline thin film having a low surface roughness of about 2 to 3 nm can be formed when the substrate temperature is kept in a range from 0 to 200° C. While a low surface roughness of about 2 to 3 nm can be achieved when the substrate temperature is kept at 0° C. or lower, the (110) plane cannot be aligned, i.e., namely the orientation of the (110) plane is poor.

TABLE 1

| Temperature | Surface roughness | Crystal orientation (220) full width at half maximum (Rocking curve) |
|---|---|---|
| 800° C. | 30–50 nm | 10.0° |
| 500° C. | 20–30 nm | 5.0° |
| 300° C. | 5–10 nm | 3.5° |
| 200° C. | 3–5 nm | 3.3° |
| 100° C. | 2–3 nm | 3.4° |
| 50° C. | 2–3 nm | 3.5° |
| 25° C. | 2–3 nm | 3.8° |
| 0° C. | 2–3 nm | 4.2° |

TABLE 1-continued

| Temperature | Surface roughness | Crystal orientation (220) full width at half maximum (Rocking curve) |
|---|---|---|
| −25° C. | 2–3 nm | 5.0° |
| −50° C. | 2–3 nm | 8.0° |

(Experiment 3)

Polycrystalline thin films of MgO were formed similarly to the first experiment except for changing the pressure in the vacuum vessel (degree of vacuum) when forming the MgO film, and the surface roughness and crystal orientation of each of the polycrystalline thin films of MgO were measured. The results of the measurements are shown in Table 2.

The results indicate that both the surface roughness and the crystal orientation of the MgO films deteriorate when the pressure in the vacuum vessel when forming the MgO film is higher than $3.0 \times 10^{-2}$ Pa.

When the pressure in the vacuum vessel when forming the MgO film is decreased below $3.0 \times 10^{-2}$ Pa, on the other hand, both the surface roughness and the crystal orientation of the MgO film are improved.

TABLE 2

| Pressure in vaccum vessel | Surface roughness | Crystal orientation (220) Rocking curve (Half width) |
|---|---|---|
| $5.0 \times 10^{-2}$ Pa | 5–10 nm | 8.5° |
| $4.0 \times 10^{-2}$ Pa | 3–5 nm | 4.0° |
| $3.0 \times 10^{-2}$ Pa | 2–3 nm | 3.4° |
| $2.0 \times 10^{-2}$ Pa | 2–3 nm | 3.2° |
| $1.0 \times 10^{-2}$ Pa | 2–3 nm | 3.5° |

(Experiment 4)

Polycrystalline thin films of MgO were formed by sputtering with ion beam irradiation by means of an apparatus having the constitution shown in FIG. 1, similarly to the first experiment except for changing the ion beam energy when forming the MgO film, and the surface roughness and crystal orientation of each of the polycrystalline thin films of MgO were measured. The results of the measurements are shown in Table 3.

The results indicate that the surface roughness and the crystal orientation of the MgO film deteriorate when the ion beam energy exceeds 2000 eV when forming the MgO film.

It can be seen that, when the ion beam energy is set within a range from 1000 eV to 2000 eV, on the other hand, a satisfactory surface roughness and crystal orientation of the polycrystalline thin film of MgO can be achieved. It can also be seen that, when the ion beam energy is set in a range from 1000 eV to 1600 eV, on the other hand, a satisfactory surface roughness of the polycrystalline thin film of MgO and a crystal orientation of 4.0° or less can be achieved. When the ion beam energy is set in a range from 1200 eV to 1500 eV, the crystal orientation of the polycrystalline thin film of MgO can be kept within 3.50°.

TABLE 3

| Ion beam energy | Surface roughness | Crystal orientation (220) Rocking curve |
|---|---|---|
| 2500 eV | 5–10 nm | 8.0° |
| 2000 eV | 3–5 nm | 5.0° |
| 1600 eV | 2–3 nm | 4.0° |
| 1500 eV | 2–3 nm | 3.2° |
| 1400 eV | 2–3 nm | 3.3° |

TABLE 3-continued

| Ion beam energy | Surface roughness | Crystal orientation (220) Rocking curve |
|---|---|---|
| 1300 eV | 2–3 nm | 3.4° |
| 1200 eV | 2–3 nm | 3.4° |
| 1000 eV | 3–5 nm | 4.0° |
| 900 eV | 3–5 nm | 5.0° |
| 800 eV | 5–10 nm | 8.0° |

What is claimed is:

1. A method of producing a polycrystalline thin film of MgO, wherein an ion beam sputtering process is employed to form the polycrystalline thin film of MgO on a substrate by irradiating a target with an ion beam to dislodge particles from the target, and deposit the particles on the substrate; and wherein the film is formed while controlling the ion beam energy in a range from 1000 to 2000 eV.

2. A method of producing a polycrystalline thin film of MgO as claimed in claim 1, wherein the film is formed while controlling the ion beam energy in a range from 1200 to 1500 eV.

3. A method of producing a polycrystalline thin film of MgO as claimed in claim 1, wherein the film is formed in an atmosphere at a reduced pressure of $3.0 \times 10^{-2}$ Pa or lower at the substrate temperature of 300° C. or lower.

4. A method of producing a polycrystalline thin film of MgO as claimed in claim 1, wherein the film is formed while controlling the ion beam energy in a range from 1000 to 2000 eV and the substrate temperature at 300° C. or lower.

5. A method of producing a polycrystalline thin film of MgO as claimed in claim 1, wherein the film is formed in an atmosphere at a reduced pressure of $3.0 \times 10^{-2}$ Pa or lower and the ion beam energy is controlled in a range from 1000 to 2000 eV.

6. A method of producing a polycrystalline thin film of MgO as claimed in claim 1, wherein the film is formed in an atmosphere under a reduced pressure of $3.0 \times 10^{-2}$ Pa or lower, with the ion beam energy controlled in a range from 1200 to 1500 eV and the substrate temperature in a range from 0 to 200° C.

7. A method of producing a polycrystalline thin film of MgO as claimed in claim 1, wherein a plane of the polycrystalline thin film of MgO formed on the substrate is oriented at right angles to a surface of said substrate.

8. A method of producing a polycrystalline thin film of MgO as claimed in claim 1, wherein a surface roughness of the polycrystalline thin film of MgO formed on a substrate is in a range from 2 to 10 nm.

9. A method of producing a polycrystalline thin film of MgO as claimed in claim 1, wherein a surface roughness of the polycrystalline thin film of MgO formed on the substrate is in a range from 2 to 3 nm.

* * * * *